(12) United States Patent
Takahashi et al.

(10) Patent No.: US 12,148,636 B2
(45) Date of Patent: Nov. 19, 2024

(54) SUBSTRATE SUPPORT

(71) Applicant: TOKYO ELECTRON LIMITED, Tokyo (JP)

(72) Inventors: Masanori Takahashi, Miyagi (JP); Shota Ezaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 918 days.

(21) Appl. No.: 17/204,666

(22) Filed: Mar. 17, 2021

(65) Prior Publication Data

US 2021/0313202 A1 Oct. 7, 2021

(30) Foreign Application Priority Data

Apr. 1, 2020 (JP) ................. 2020-065964

(51) Int. Cl.
*H01L 21/67* (2006.01)
*F25B 21/04* (2006.01)
*H01J 37/32* (2006.01)
*H01L 21/683* (2006.01)

(52) U.S. Cl.
CPC ........ *H01L 21/67103* (2013.01); *F25B 21/04* (2013.01); *H01J 37/3244* (2013.01); *H01J 37/32724* (2013.01); *H01L 21/67109* (2013.01); *H01L 21/67248* (2013.01); *H01J 37/32091* (2013.01); *H01J 2237/334* (2013.01); *H01L 21/67069* (2013.01); *H01L 21/6833* (2013.01)

(58) Field of Classification Search
CPC ........ H01L 21/67103; H01L 21/67109; H01L 21/67248; H01L 21/67069; H01L 21/6833; F25B 21/04; H01J 37/3244; H01J 37/32724; H01J 37/32091; H01J 2237/334

See application file for complete search history.

(56) References Cited

U.S. PATENT DOCUMENTS

| | | | |
|---|---|---|---|
| 2007/0138134 A1* | 6/2007 | Hsieh .................. | H01J 37/3244 257/E21.252 |
| 2009/0129020 A1* | 5/2009 | Fujiwara ................ | G06F 1/203 361/697 |
| 2019/0295865 A1* | 9/2019 | Hanawa ............ | H01L 21/67248 |
| 2023/0127806 A1* | 4/2023 | Ricci ................. | H01J 37/32935 156/345.27 |

FOREIGN PATENT DOCUMENTS

JP 2017-228230 A 12/2017

* cited by examiner

*Primary Examiner* — Keith Brian Assante
(74) *Attorney, Agent, or Firm* — Nath, Goldberg & Meyer; Jerald L. Meyer; Tanya E. Harkins (57) ABSTRACT

A substrate support for use in a substrate processing apparatus includes: a base having an internal space; an electronic circuit board disposed in the internal space; a substrate supporting plate disposed on the base; and at least one temperature adjusting element disposed in the internal space, the at least one temperature adjusting element being configured to adjust a temperature of the electronic circuit board.

8 Claims, 5 Drawing Sheets

SUBSTRATE SUPPORT

CROSS-REFERENCE TO RELATED APPLICATION

This application is based upon and claims the benefit of priority from Japanese Patent Application No. 2020-065964, filed on Apr. 1, 2020, the entire contents of which are incorporated herein by reference.

TECHNICAL FIELD

Various aspects and embodiments of the present disclosure relate to a substrate support and a substrate processing apparatus.

BACKGROUND

There is known a substrate processing apparatus provided with a plurality of heaters and capable of independently adjusting the temperatures of a plurality of regions of a substrate support on which a semiconductor wafer (hereinafter referred to as a substrate) is mounted (see, e.g., Patent Document 1). In a semiconductor manufacturing process using such a substrate processing apparatus, the uniformity of substrate processing can be improved by adjusting the temperature of the substrate with high accuracy.

PRIOR ART DOCUMENT

Patent Document

Patent Document 1: Japanese Patent Application Publication No. 2017-228230

SUMMARY

According to one embodiment of the present disclosure, there is provided a substrate support for use in a substrate processing apparatus. The substrate support includes: a base having an internal space; an electronic circuit board disposed in the internal space; a substrate supporting plate disposed on the base; and at least one temperature adjusting element disposed in the internal space, the at least one temperature adjusting element being configured to adjust a temperature of the electronic circuit board.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate support and a substrate processing apparatus will be described in detail with reference to the drawings. It should be noted that the following embodiments do not limit the substrate support and the substrate processing apparatus disclosed herein.

The temperature of a substrate mounted on a substrate support is adjusted by controlling the electric power supplied to a heater embedded in the substrate support through the use of a control circuit. If the control circuit that controls the heater is arranged outside a chamber for accommodating the substrate support, a wiring line for transmitting a control signal from the control circuit to the heater is provided between the substrate support and the control circuit. As the number of heaters embedded in the substrate support increases, so does the number of wiring lines provided between the substrate support and the control circuit. As a result, a space for routing the wiring line is required in the substrate processing apparatus, which makes it difficult to downsize the substrate processing apparatus. Therefore, it is conceivable to arrange a control circuit inside the substrate support.

Depending on the substrate processing recipe, the temperature of the substrate may be set to a temperature of 0 degrees C. or less, or may be set to a temperature of 100 degrees C. or more. In this case, the temperature of the control circuit arranged inside the substrate support may also be 0 degrees C. or less, or 100 degrees C. or more. An electronic circuit such as a microcomputer or the like may be used as the control circuit. The control circuit may malfunction at a temperature of 0 degrees C. or less, or a temperature of 100 degrees C. or more. If the control circuit malfunctions, it becomes difficult to implement a processing environment predetermined in the processing recipe. As a result, the processing accuracy of the substrate is lowered.

Therefore, the present disclosure provides a technique capable of suppressing a decrease in the accuracy of environmental control in substrate processing.

[Configuration of Substrate Processing Apparatus 1]

Figure 1:
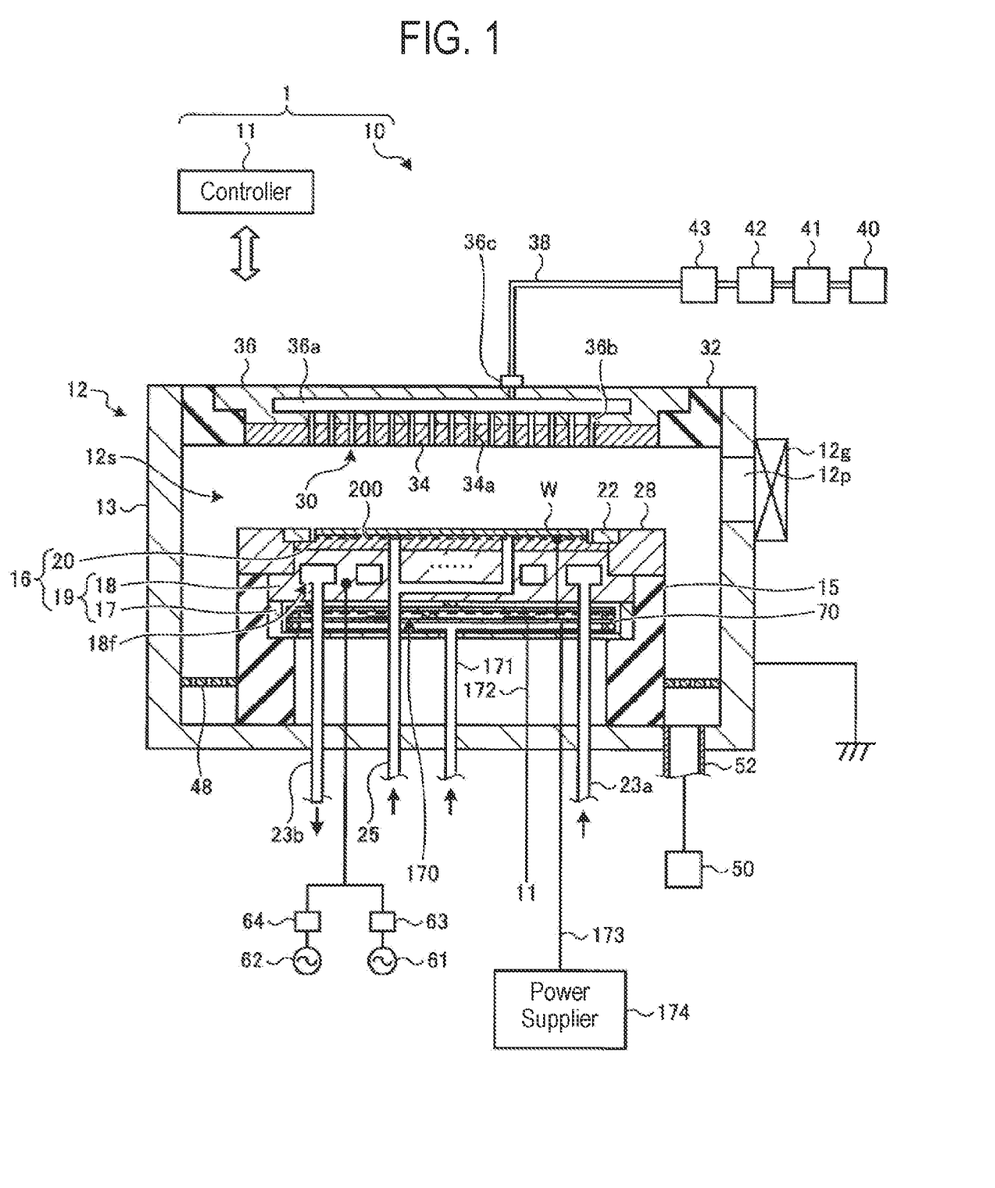
FIG. 1 is a schematic sectional view showing an example of a configuration of a substrate processing apparatus according to an embodiment of the present disclosure.

FIG. 1 is a schematic sectional view showing an example of the configuration of the substrate processing apparatus 1 according to the embodiment of the present disclosure. The substrate processing apparatus 1 includes an apparatus main body 10 and a controller 11 that controls the apparatus main body 10. The substrate processing apparatus 1 according to the present embodiment is, for example, a capacitively coupled plasma etching apparatus.

The apparatus main body 10 includes a chamber 12. The chamber 12 provides an internal space 12s therein. The chamber 12 includes a housing 13 formed in a substantially cylindrical shape by, for example, aluminum or the like. The internal space 12s is provided in the housing 13. The housing 13 is electrically grounded. The inner wall surface of the housing 13, i.e., the wall surface that defines the internal space 12s, is coated with a plasma-resistant film formed by, for example, an anodizing process or the like.

An opening 12p through which the substrate W passes when the substrate W is transferred between the internal space 12s and the outside of the chamber 12 is formed on the side wall of the housing 13. The opening 12p is opened and closed by a gate valve 12g.

A substrate support 16 on which the substrate W is mounted is installed in the housing 13. The substrate support 16 is supported by a support portion 15 formed in a substantially cylindrical shape by, for example, an insulating material such as quartz or the like. The support portion 15 extends upward from the bottom of the housing 13.

The substrate support 16 includes a base 19 and an electrostatic chuck 20. The base 19 includes a cover plate 17 and a lower electrode 18. The electrostatic chuck 20 is installed on the lower electrode 18 of the base 19. The substrate W is placed on the electrostatic chuck 20. The electrostatic chuck 20 includes a main body formed of an insulator and an electrode formed in a film shape. A DC power source (not shown) is electrically connected to the electrode of the electrostatic chuck 20. When a voltage is applied to the electrode of the electrostatic chuck 20 from the DC power source, an electrostatic force is generated on the surface of the electrostatic chuck 20, and the substrate W is attracted to and held on the upper surface of the electrostatic chuck 20 by the electrostatic force. The electrostatic chuck 20 is an example of a mounting portion (substrate supporting plate).

Figure 2:
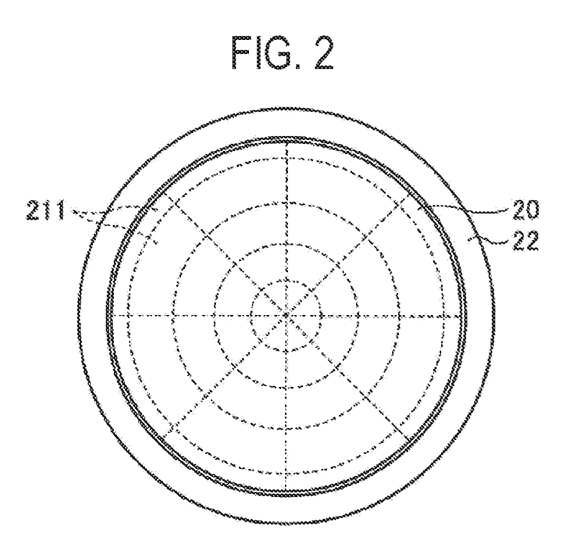
FIG. 2 is a diagram showing an example of an upper surface of an electrostatic chuck.

Further, the electrostatic chuck 20 is divided into a plurality of divided regions 211, for example, as shown in FIG. 2. FIG. 2 is a diagram showing an example of the upper surface of the electrostatic chuck 20. One heater 200 is embedded in each of the divided regions 211 inside the electrostatic chuck 20. The temperature of each of the divided regions 211 is individually controlled by each heater 200. This makes it possible to improve the temperature uniformity of the surface of the substrate W. The heater 200 may be arranged between the electrostatic chuck 20 and the lower electrode 18.

The electrostatic chuck 20 is provided with a pipe 25 for supplying a heat transfer gas, such as a He gas, to between the electrostatic chuck 20 and the substrate W. By controlling the pressure of the heat transfer gas supplied to between the electrostatic chuck 20 and the substrate W, it is possible to control the thermal conductivity between the electrostatic chuck 20 and the substrate W.

The lower electrode 18 is formed in a substantially disk shape by a conductive material such as aluminum. A flow path 18f through which a refrigerant, such as CFC, flows is formed in the lower electrode 18. The refrigerant is supplied from a chiller unit (not shown) into the flow path 18f via a pipe 23a. The refrigerant circulating in the flow path 18f is returned to the chiller unit via a pipe 23b. The lower electrode 18 can be cooled to a predetermined temperature by allowing the refrigerant whose temperature is controlled by the chiller unit, to circulate in the flow path 18f. The lower electrode 18 is an example of an upper base.

The cover plate 17 is formed in a substantially disk shape by a conductive material such as, for example, aluminum or the like. The cover plate 17 is arranged below the lower electrode 18 and is electrically connected to the lower electrode 18. A recess is formed in the cover plate 17. A space 170 (internal space) surrounded by the lower surface of the lower electrode 18 and the recess of the cover plate 17 is formed in the base 19. In the space 170 of the base 19, there is arranged a circuit board 70 equipped with an electronic circuit such as a microcomputer or the like for controlling the plurality of heaters 200 arranged in the electrostatic chuck 20. The cover plate 17 is an example of a lower base.

A pipe 171 for supplying a low-humidity gas into the space 170 is connected to the cover plate 17. By supplying the low-humidity gas into the space 170, dew condensation in the space 170 is suppressed. In this embodiment, the low-humidity gas is, for example, a dry air.

One end of a wiring line 173 is connected to the circuit board 70, and the other end of the wiring line 173 is connected to a power supplier 174 provided outside the chamber 12. The electronic circuit mounted on the circuit board 70 supplies the electric power supplied from the power supplier 174 via the wiring line 173 to each of the heaters 200. Further, one end of a wiring line 172 such as an optical fiber cable for performing communication between the electronic circuit mounted on the circuit board 70 and the controller 11 is connected to the circuit board 70. The other end of the wiring line 172 is connected to the controller 11. The electronic circuit mounted on the circuit board 70 controls the electric power supplied from the power supplier 174 to each of the heaters 200 in response to an instruction from the controller 11. The other end of the wiring line 172 may be connected to an other electronic circuit provided outside the housing 13. In this case, the other electronic circuit relays the communication between the electronic circuit of the circuit board 70 and the controller 11 by communicating with the controller 11 via a communication line such as a LAN or the like.

An edge ring 22 formed in an annular shape by a conductive material such as, for example, silicon or the like is installed on the outer peripheral region of the electrostatic chuck 20. The edge ring 22 is sometimes called a focus ring. The edge ring 22 is arranged so as to surround the substrate W mounted on the electrostatic chuck 20.

On the side surface of the substrate support 16, a cover member 28 formed in a substantially cylindrical shape by an insulating material is installed so as to surround the substrate support 16. The cover member 28 protects the side surface of the substrate support 16 from the plasma generated in the internal space 12s.

An upper electrode 30 is installed above the substrate support 16. The upper electrode 30 is supported on the upper portion of the housing 13 via a member 32 made of an insulating material. The upper electrode 30 includes a ceiling plate 34 and a ceiling plate holding portion 36. The lower surface of the ceiling plate 34 faces the internal space 12s. The ceiling plate 34 has a plurality of gas discharge holes 34a that penetrate the ceiling plate 34 in the thickness direction. The ceiling plate 34 is made of, for example, silicon or the like. In addition, the ceiling plate 34 may be made of, for example, aluminum or the like having a plasma-resistant coating on its surface.

The ceiling plate holding portion 36 supports and holds the ceiling plate 34 in a detachable manner. The ceiling plate holding portion 36 is made of a conductive material such as, for example, aluminum or the like. A gas diffusion chamber 36a is formed inside the ceiling plate holding portion 36. A plurality of gas holes 36b extend downward from the gas diffusion chamber 36a. The gas holes 36b communicates with the gas discharge holes 34a. The ceiling plate holding portion 36 is provided with a gas introduction port 36c connected to the gas diffusion chamber 36a. One end of a pipe 38 is connected to the gas introduction port 36c.

A gas source group 40 is connected to the other end of the pipe 38 via a valve group 43, a flow rate controller group 42 and a valve group 41. The gas source group 40 includes a plurality of gas sources for supplying a gas contained in an etching gas. Each of the valve group 41 and the valve group 43 includes a plurality of valves (e.g., opening/closing valves). The flow rate controller group 42 includes a plurality of flow rate controllers such as, for example, mass flow controllers or the like.

Each of the gas sources included in the gas source group 40 is connected to the pipe 38 via a corresponding valve in the valve group 41, a corresponding flow rate controller in the flow rate controller group 42, and a corresponding valve in the valve group 43. The gases from one or more gas sources selected from the plurality of gas sources included in the gas source group 40 are supplied into the gas diffusion chamber 36a at individually adjusted flow rates. The gases supplied into the gas diffusion chamber 36a are diffused in the gas diffusion chamber 36a and are supplied into the internal space 12s in a shower shape through the gas holes 36b and the gas discharge holes 34a.

A baffle plate 48 made of, for example, aluminum or the like having a plasma-resistant coating on the surface thereof is provided between the side wall of the support portion 15 and the side wall of the housing 13. The baffle plate 48 has a plurality of through-holes penetrating the baffle plate 48 in the thickness direction thereof. An exhaust pipe 52 is connected to the bottom of the housing 13 below the baffle plate 48. An exhaust device 50 including a pressure controller such as an automatic pressure control valve and a vacuum pump such as a turbo molecular pump is connected to the exhaust pipe 52. The exhaust device 50 can reduce the pressure in the internal space 12s to a predetermined pressure.

A first RF power source 61 is connected to the base 19 via a first matcher 63. The first RF power source 61 is a power source that generates a first RF power for plasma generation. The frequency of the first RF power is a frequency in the range of 27 to 100 MHz, for example, a frequency of 60 MHz. The first matcher 63 includes a matching circuit for matching the output impedance of the first RF power source 61 with the impedance on the load side (e.g., the base 19 side). The first RF power source 61 may be connected to the upper electrode 30 instead of the base 19 via the first matcher 63.

Further, a second RF power source 62 is connected to the base 19 via a second matcher 64. The second RF power source 62 is a power source that generates a second RF power for bias for drawing ions into the substrate W. The frequency of the second RF power is lower than the frequency of the first RF power and is a frequency in the range of 400 kHz to 13.56 MHz, for example, a frequency of 400 kHz. The second matcher 64 includes a matching circuit for matching the output impedance of the second RF power source 62 with the impedance on the load side (e.g., the base 19 side).

The controller 11 includes a memory, a processor, and an input/output interface. Data such as recipes or the like and programs are stored in the memory. The memory is a non-transient computer readable storage, for example, a RAM (Random Access Memory), a ROM (Read Only Memory), a HDD (Hard Disk Drive), a SSD (Solid State Drive), or the like. By executing the program read from the memory, the processor controls each part of the apparatus main body 10 via the input/output interface based on the data such as the recipes stored in the memory. The processor is a CPU (Central Processing Unit), a DSP (Digital Signal Processor), or the like.

When plasma etching is performed by the substrate processing apparatus 1, the gate valve 12g is first opened, the substrate W is loaded into the housing 13 by a transfer robot (not shown) and placed on the electrostatic chuck 20, and the gate valve 12g is closed. Then, the gas in the housing 13 is exhausted by the exhaust device 50, one or more gases from the gas source group 40 are supplied to the internal space 12s at predetermined flow rates, and the pressure in the internal space 12s is adjusted to a predetermined pressure.

Further, the lower electrode 18 is cooled by supplying a refrigerant whose temperature is controlled by a chiller unit (not shown) into the flow path 18f. Moreover, the electric power supplied from the power supplier 174 to the heaters 200 provided in the respective divided regions 211 of the electrostatic chuck 20 is controlled by the electronic circuit of the circuit board 70. In addition, the controller 11 controls the pressure of the heat transfer gas supplied to between the electrostatic chuck 20 and the substrate W. As a result, the temperature of the substrate W mounted on the electrostatic chuck 20 is adjusted to a predetermined temperature.

Then, the first RF power from the first RF power source 61 and the second RF power from the second RF power source 62 are supplied to the base 19. As a result, an electric field of RF is formed between the upper electrode 30 and the base 19, and the gas supplied to the internal space 12s is turned into plasma. Then, the substrate W is etched by ions, radicals and the like contained in the plasma generated in the internal space 12s.

[Details of Substrate Support 16]

Figure 3:
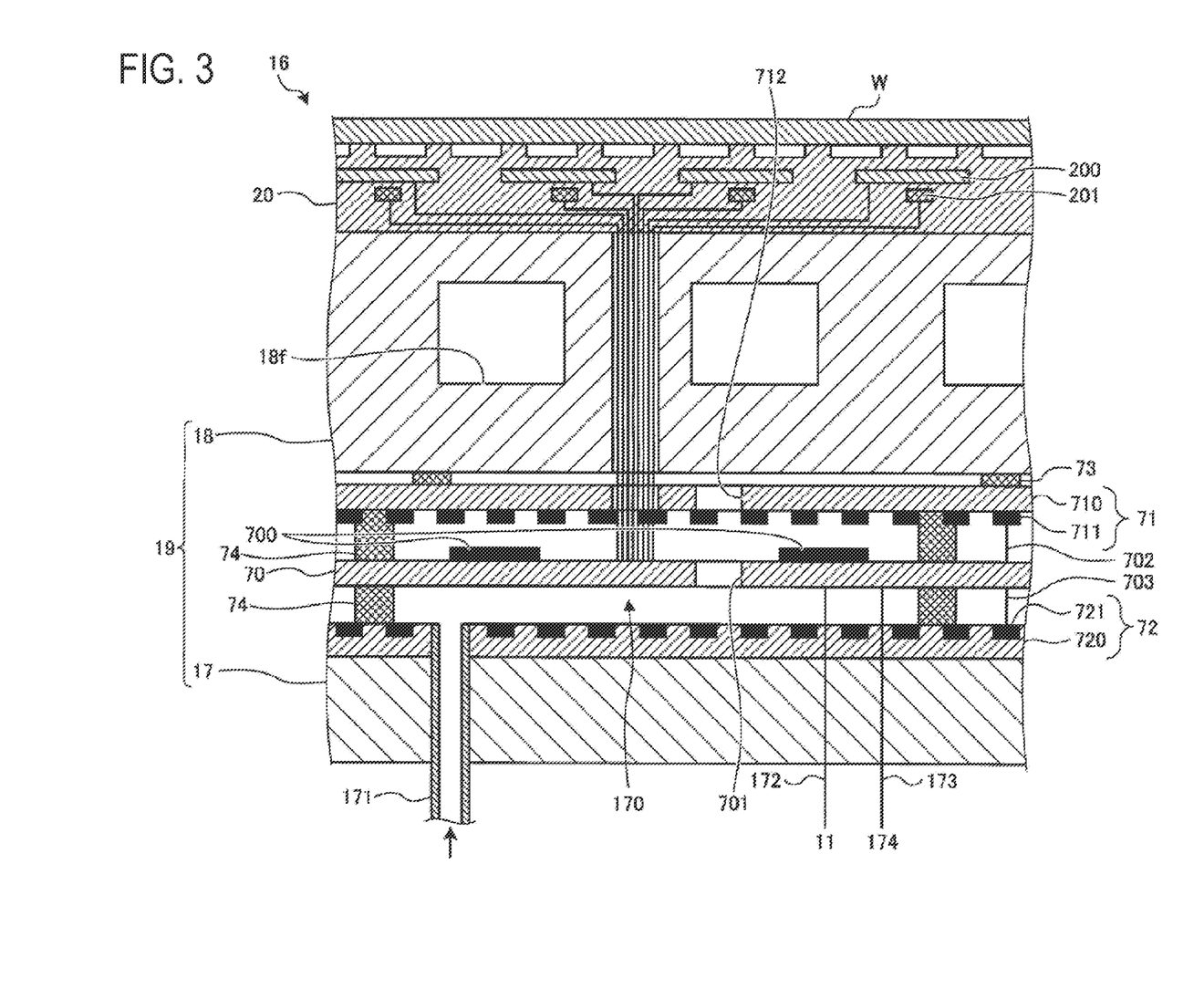
FIG. 3 is an enlarged sectional view showing an example of a detailed structure of a substrate support.

FIG. 3 is an enlarged sectional view showing an example of the detailed structure of the substrate support 16. In the present embodiment, the heaters 200 and the temperature sensors 201 are arranged for the respective divided regions 211 in the electrostatic chuck 20. The temperature sensors 201 are arranged between the heaters 200 and the lower electrode 18. The temperature sensors 201 are, for example, thermistors. The temperature sensors 201 may be arranged between the heaters 200 and the upper surface of the electrostatic chuck 20.

The heaters 200 and the temperature sensors 201 are respectively connected to the circuit board 70 via the wiring lines arranged in the through-holes formed in the lower electrode 18. The circuit board 70 is provided with an electronic circuit 700 such as a microcomputer or the like that controls the electric power supplied to the corresponding heater 200 based on the temperature measured by each of the temperature sensors 201.

A temperature adjusting portion 71 and a temperature adjusting portion 72 are arranged in the space 170 surrounded by the lower surface of the lower electrode 18 and the recess of the cover plate 17. The temperature adjusting portion 71 includes a thermal insulating member 710 and a heater 711 (temperature adjusting element). The heater 711 is provided on the lower surface of the thermal insulating member 710, and the thermal insulating member 710 is supported on the lower surface of the lower electrode 18 via spacers 73. The thermal insulating member 710 and the spacers 73 are made of a heat-insulating and electrically-insulating resin, ceramics or the like. The heater 711 is connected to the circuit board 70 via a wiring line 702 to generate heat according to the electric power supplied from the circuit board 70 via the wiring line 702. The thermal insulating member 710 is an example of a first thermal insulating member, and the heater 711 is an example of a first heater. In addition, the wiring line 702 may directly supply electric power to the heater 711 without going through the circuit board 70.

The circuit board 70 has one or more through-holes 701, and the thermal insulating member 710 has one or more through-holes 712. As a result, the low-humidity gas supplied from the pipe 171 into the space 170 spreads into the space 170 via the through-holes 701 and the through-holes 712.

The temperature adjusting portion 72 includes a protective member 720 (thermal insulating member) and a thermal spray heater 721 (temperature adjusting element). The protective member 720 is made of a heat-insulating and electrically-insulating resin, ceramics or the like and is provided on the upper surface of the recess of the cover plate 17. The thermal spray heater 721 is provided on the protective member 720. The thermal spray heater 721 is insulated from the cover plate 17 by the protective member 720. The thermal spray heater 721 is connected to the circuit board 70 via a wiring line 703 to generate heat according to the electric power supplied from the circuit board 70 via the wiring line 703. The thermal spray heater 721 is formed by spraying a metal serving as a heater onto the protective member 720. However, the heater provided on the protective member 720 is not limited to the thermal spray heater 721. The heater included in the temperature adjusting portion 72 may be, for example, a film-shaped heater attached on the protective member 720. Further, the temperature adjusting portion 71 may have the same structure as the temperature adjusting portion 72.

Further, spacers 74 are provided between the temperature adjusting portion 71 and the circuit board 70, and between the circuit board 70 and the temperature adjusting portion 72. The circuit board 70 and the heater 711 are arranged to be spaced apart from each other. The circuit board 70 and the thermal spray heater 721 are arranged to be spaced apart from each other. As a result, it is possible to prevent the electronic circuit 700 mounted on the circuit board 70 from being overheated.

In the present embodiment, by interposing the spacers 73 between the lower surface of the lower electrode 18 and the thermal insulating member 710, a space is formed between the lower surface of the lower electrode 18 and the thermal insulating member 710. As a result, it is possible to suppress heat exchange between the lower electrode 18 and the heater 711. If a space can be provided between the upper surface of the thermal insulating member 710 and the lower surface of the lower electrode 18 by adjusting the distance between the circuit board 70 and the thermal insulating member 710 with the spacers 74, the spacers 73 may not be provided.

The circuit board 70 is provided with a temperature sensor (not shown), and the electronic circuit 700 mounted on the circuit board 70 controls the electric power supplied to the heater 711 and the thermal spray heater 721 according to the temperature measured by the temperature sensor. The heater 711 and the thermal spray heater 721 heat the circuit board 70 via the air in the space 170 by generating heat according to the electric power supplied from the circuit board 70. As a result, the circuit board 70 is cooled by the lower electrode 18 cooled by the refrigerant circulating in the flow path 18f. This makes it possible to prevent the temperature of the electronic circuit 700 on the circuit board 70 from deviating from the operation allowable range of the electronic circuit 700.

The first embodiment has been described above. As described above, the substrate support 16 according to the present embodiment includes the electrostatic chuck 20, the base 19, the circuit board 70, the temperature adjusting portion 71, and the temperature adjusting portion 72. The substrate W is placed on the electrostatic chuck 20. The base 19 is arranged under the electrostatic chuck 20, and has the space 170 formed therein. The circuit board 70 is arranged in the space 170 of the base 19. The electronic circuit 700 is mounted on the circuit board 70. The temperature adjusting portion 71 adjusts the temperature of the circuit board 70. As a result, the fluctuation in the temperature of the electronic circuit 700 can be suppressed to fall within the operation allowable range of the electronic circuit 700, and the deterioration of the accuracy of the environment control in the processing of the substrate W can be suppressed.

Further, in the above-described embodiment, the base 19 includes the lower electrode 18 arranged near the electrostatic chuck 20, and the cover plate 17 arranged under the lower electrode 18. The space 170 in the base 19 is formed between the lower electrode 18 and the cover plate 17. The temperature adjusting portion 71 includes the thermal insulating member 710 arranged between the lower surface of the lower electrode 18 and the circuit board 70, and the heater 711 arranged between the thermal insulating member 710 and the circuit board 70. By interposing the thermal insulating member 710 between the lower electrode 18 and the heater 711, it is possible to suppress heat exchange between the lower electrode 18 and the heater 711.

Further, in the above-described embodiment, a space is provided between the lower surface of the lower electrode 18 and the thermal insulating member 710. As a result, it is possible to further suppress heat exchange between the lower electrode 18 and the heater 711.

Further, the substrate processing apparatus 1 according to the above-described embodiment includes the chamber 12 configured to accommodate the substrate W. and the substrate support 16 arranged in the chamber 12 and configured to mount the substrate W thereon. The substrate support 16 includes the electrostatic chuck 20, the base 19, the circuit board 70, and the temperature adjusting portion 71. The substrate W is placed on the electrostatic chuck 20. The base 19 is arranged under the electrostatic chuck 20, and has the space 170 formed therein. The circuit board 70 is arranged in the space 170 of the base 19, and the electronic circuit 700 is mounted on the circuit board 70. The temperature adjusting portion 71 adjusts the temperature of the circuit board 70. As a result, the fluctuation in the temperature of the electronic circuit 700 can be suppressed to fall within the operation allowable range of the electronic circuit 700, and the deterioration of the accuracy of the environment control in the processing of the substrate W can be suppressed.

[Others]

The technique disclosed in the subject application is not limited to the above-described embodiment, and may be modified in various ways within the scope of the gist thereof.

Figure 4:
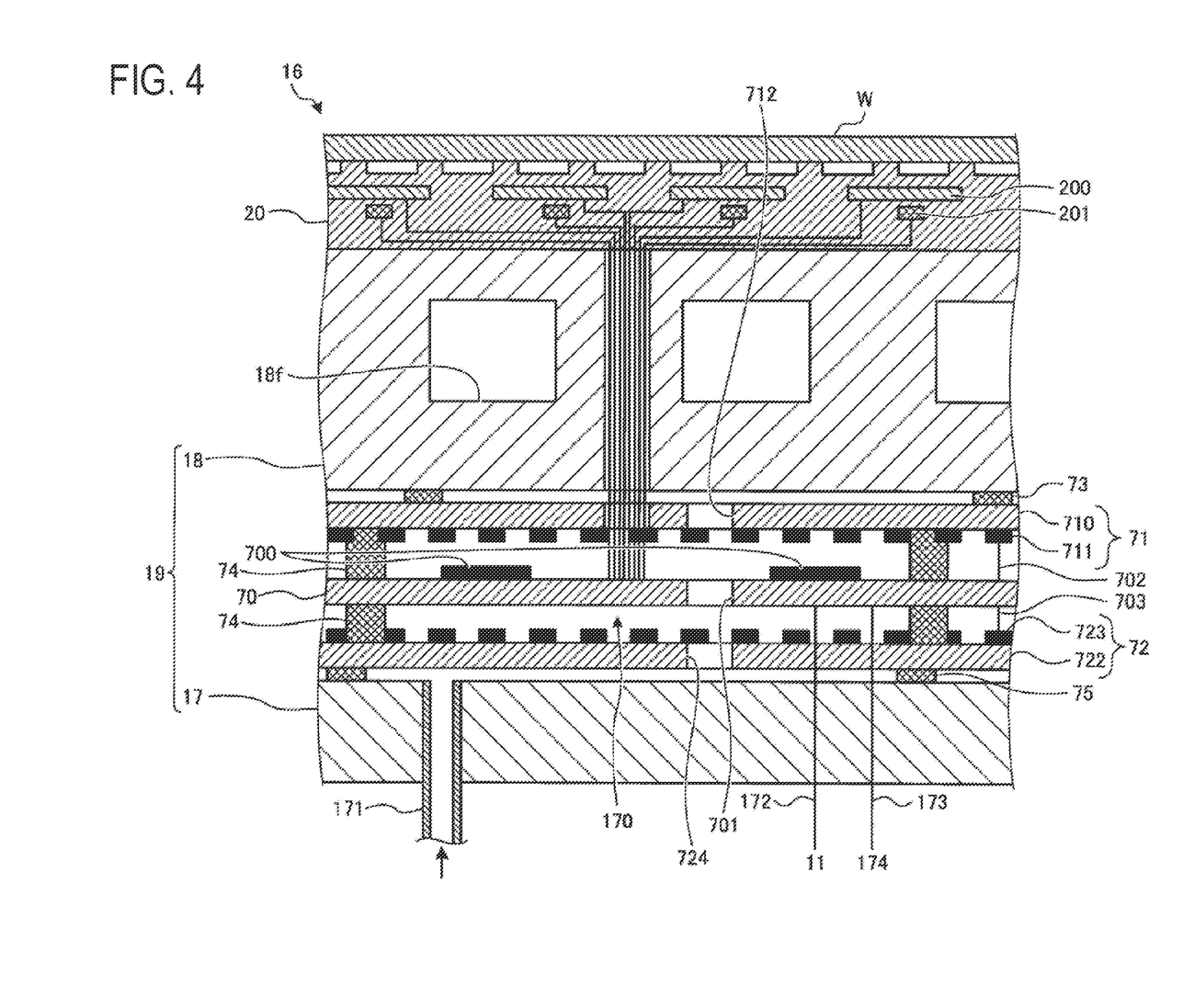
FIG. 4 is an enlarged sectional view showing another example of the detailed structure of the substrate support.

For example, as shown in FIG. 4, for example, a temperature adjusting portion 72 having the same structure as the temperature adjusting portion 71 may be provided on the upper surface of the recess of the cover plate 17. FIG. 4 is an enlarged sectional view showing another example of the detailed structure of the substrate support 16.

The temperature adjusting portion 72 illustrated in FIG. 4 includes a thermal insulating member 722 and a heater 723. The heater 723 is installed on the upper surface of the thermal insulating member 722, and the thermal insulating member 722 is supported on the upper surface of the cover plate 17 via spacers 75. The thermal insulating member 722 has one or more through-holes 724. The thermal insulating member 722 and the spacers 75 are made of a heat-insulating and electrically-insulating resin, ceramics or the like. The heater 723 is connected to the circuit board 70 via a wiring line 703 to generate heat according to the electric power supplied from the circuit board 70 via the wiring line 703. The thermal insulating member 722 is an example of a second thermal insulating member, and the heater 723 is an example of a second heater.

In the example of FIG. 4, by interposing the spacers 75 between the upper surface of the cover plate 17 and the thermal insulating member 722, a space is formed between the upper surface of the cover plate 17 and the thermal insulating member 722. As a result, it is possible to suppress heat exchange between the cover plate 17 and the heater 723. Even with such a configuration, the fluctuation in the temperature of the electronic circuit 700 can be suppressed to fall within the operation allowable range of the electronic circuit 700.

Figure 5:
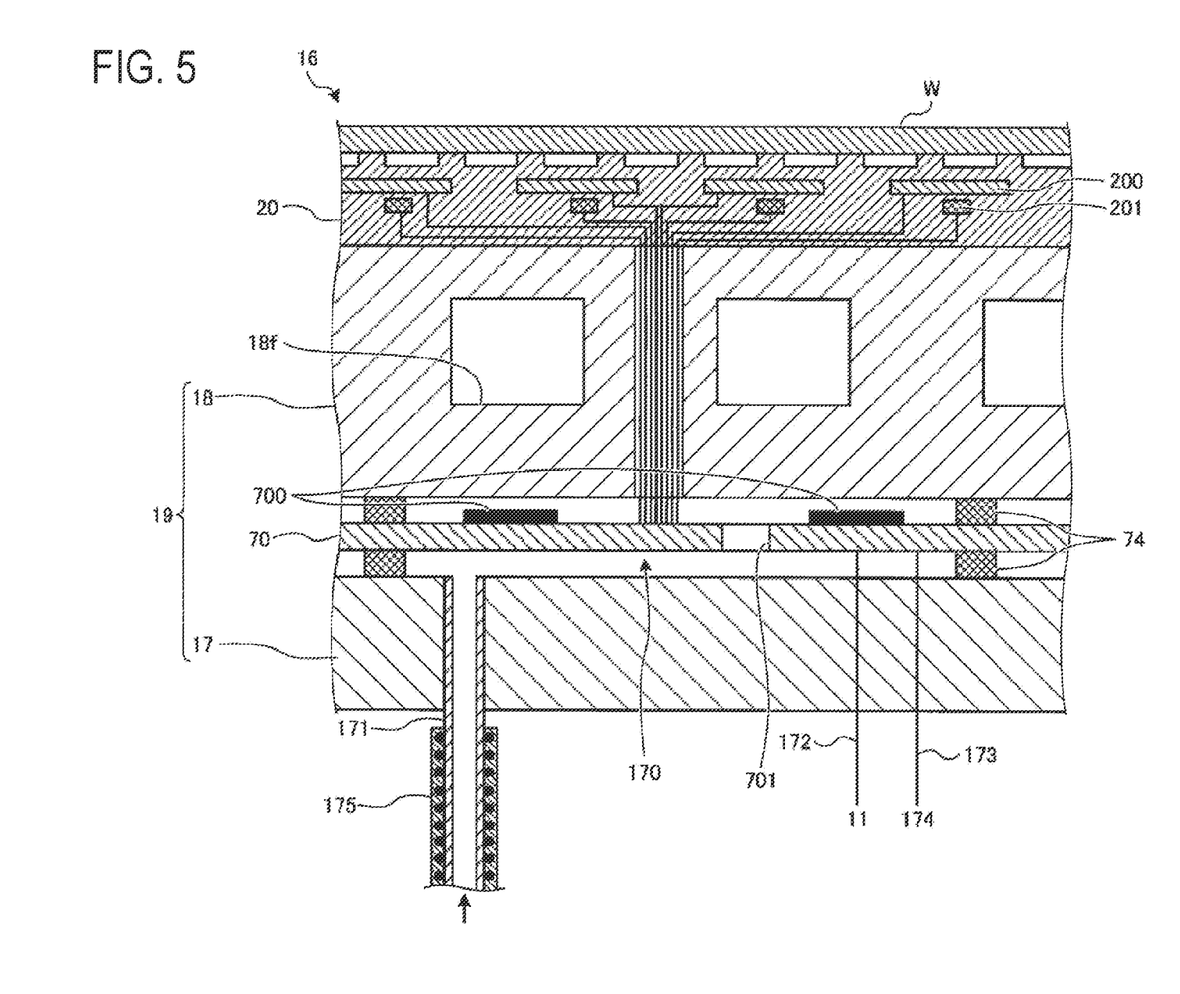
FIG. 5 is an enlarged sectional view showing another example of the detailed structure of the substrate support.

Further, in the above-described embodiment, the gas in the space 170 is heated by the heater 711 and the thermal spray heater 721 provided in the space 170 of the base 19. However, the disclosed technique is not limited thereto. As another form, the gas flowing in the pipe 171 may be heated, for example, as shown in FIG. 5. FIG. 5 is an enlarged sectional view showing another example of the detailed structure of the substrate support.

In the example of FIG. 5, a heater 175 is wound around the pipe 171. The heater 175 is an example of a temperature adjusting portion. The controller 11 acquires the temperature information measured by the temperature sensor mounted on the circuit board 70 via the wiring line 172. Then, the controller 11 controls the electric power supplied to the heater 175 according to the acquired temperature information. As the pipe 171 is heated by the heater 175, the gas flowing in the pipe 171 is heated and the heated gas is supplied into the space 170. By supplying the heated gas into the space 170, the circuit board 70 is heated by the heated gas. Even with such a configuration, the fluctuation in the temperature of the electronic circuit 700 can be suppressed to fall within the operation allowable range of the electronic circuit 700. The configuration illustrated in FIG. 5 may be combined with the configuration illustrated in FIG. 3 or the configuration illustrated in FIG. 4.

Further, in the above-described embodiment, the gas in the space 170 is heated by the heater 711 and the thermal spray heater 721 provided in the space 170 of the base 19. However, the disclosed technique is not limited thereto. For example, the space 170 of the base 19 may be filled with a material having a thermal insulating property and an electrically-insulating property (e.g., a resin). The electronic circuit 700 generates some heat during its operation. Therefore, by covering the electronic circuit 700 with a resin or the like, a drop in the temperature of the electronic circuit 700 can be suppressed by its own heat generation.

Further, in the above-described embodiment, the gas in the space 170 is heated by the heater 711 and the thermal spray heater 721 provided in the space 170 of the base 19. However, the disclosed technique is not limited thereto. As another form, for example, a heater may be embedded in the circuit board 70, and the electronic circuit 700 may be heated by the heater via the circuit board 70. In addition, a sheet-shaped heater may be attached to the circuit board 70 or the electronic circuit 700.

Further, in the above-described embodiment, the case of suppressing the drop in the temperature of the electronic circuit 700 has been described. However, the disclosed technique is not limited thereto. Depending on the processing recipe for the substrate W, the temperature of the substrate W may be set to a temperature of 100 degrees C. or more. When the temperature of the substrate W is set to 100 degrees C. or more, the temperature of the refrigerant circulating in the flow path 18*f* may reach several tens degrees C. In such a case, it is necessary to cool the electronic circuit 700. Therefore, a cooling member such as a Peltier element or the like is provided instead of the heater 711 and the thermal spray heater 721. Further, when processing is performed in the substrate processing apparatus 1 at various temperatures within the range of 0 degrees C. or less to 100 degrees C. or more, a cooling member such as a Peltier element or the like is provided in addition to the heater 711 and the thermal spray heater 721. As a result, the fluctuation in the temperature of the electronic circuit 700 can be suppressed to fall within the operation allowable range of the electronic circuit 700.

Further, in the above-described embodiment, the electronic circuit 700 controls the plurality of heaters 200 in the electrostatic chuck 20. However, the control performed by the electronic circuit 700 is not limited thereto. The electronic circuit 700 may perform various kinds of control relating to the substrate support 16. The various kinds of control relating to the substrate support 16 may include, for example, control of the attraction and the attraction release of the substrate W on the electrostatic chuck 20, control of the attraction and the attraction release of the edge ring 22 when the edge ring 22 is attracted to the electrostatic chuck 20 by static electricity, and the like.

Further, in the above-described embodiment, the substrate processing apparatus 1 that performs processing using capacitively coupled plasma (CCP) as an example of the plasma source has been described. However, the plasma source is not limited thereto. Plasma sources other than the capacitively coupled plasma include, for example, inductively coupled plasma (ICP), microwave-excited surface wave plasma (SWP), electron cyclotron resonance plasma (ECP), and helicon wave-excited plasma (HWP), and the like.

Further, in the above-described embodiment, the apparatus for performing etching using plasma has been described as an example of the apparatus for performing processing on the substrate W. However, the disclosed technique is not limited thereto. The disclosed technique may be applied to, for example, a film forming apparatus, a modifying apparatus, a cleaning apparatus, or the like as long as it is an apparatus for processing the substrate W.

According to various aspects and embodiments of the present disclosure, it is possible to suppress a decrease in the accuracy of substrate processing environment control.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate support for use in a substrate processing apparatus, the substrate support comprising:
    a base having an internal space;
    an electronic circuit board disposed in the internal space;
    a substrate supporting plate disposed on the base;
    at least one temperature adjusting element disposed in the internal space, the at least one temperature adjusting element being configured to adjust a temperature of the electronic circuit board; and at least one thermal insulating member disposed in the internal space, wherein the at least one temperature adjusting element is disposed between the at least one thermal insulating member and the electronic circuit board, wherein the at least one temperature adjusting element comprises at least one upper temperature adjusting element and at least one lower temperature adjusting element, wherein the at least one upper temperature adjusting element is disposed above the electronic circuit board, and the at least one lower temperature adjusting element is disposed below the electronic circuit board, wherein the at least one thermal insulating member comprises at least one upper thermal insulating member and at least one lower thermal insulating member, and wherein the at least one upper temperature adjusting element is disposed between the at least one upper thermal insulating member and the electronic circuit board, and the at least one lower temperature adjusting element is disposed between the at least one lower thermal insulating member and the electronic circuit board.

2. The substrate support of claim 1, wherein the at least one temperature adjusting element comprises a heater.

3. The substrate support of claim 1, wherein the at least one temperature adjusting element comprises a Peltier device.

4. The substrate support of claim 1, wherein a gap is formed between the at least one thermal insulating member and the base.

5. The substrate support of claim 1, further comprising a gas supply pipe for supplying a gas into the internal space.

6. The substrate support of claim 5, further comprising at least one additional temperature adjusting element disposed so as to surround the gas supply pipe.

7. The substrate support of claim 6, wherein the gas is dry air.

8. The substrate support of claim 7, wherein the at least one additional temperature adjusting element is a heater.

* * * * *